(12) United States Patent
Bertsche et al.

(10) Patent No.: US 7,391,034 B1
(45) Date of Patent: Jun. 24, 2008

(54) ELECTRON IMAGING BEAM WITH REDUCED SPACE CHARGE DEFOCUSING

(75) Inventors: Kirk J. Bertsche, San Jose, CA (US); Harald F. Hess, La Jolla, CA (US)

(73) Assignee: KLA-Tencor Technologies Corporation, Milpitas, CA (US)

( * ) Notice: Subject to any disclaimer, the term of this patent is extended or adjusted under 35 U.S.C. 154(b) by 238 days.

(21) Appl. No.: 11/269,075

(22) Filed: Nov. 8, 2005

Related U.S. Application Data

(60) Provisional application No. 60/662,463, filed on Mar. 16, 2005.

(51) Int. Cl.
- *G21K 7/00* (2006.01)
- *G21K 1/08* (2006.01)
- *G21K 5/10* (2006.01)
- *H01K 3/14* (2006.01)

(52) U.S. Cl. .................. 250/398; 250/306; 250/307; 250/310; 250/311; 250/396 R; 250/492.22; 250/492.3

(58) Field of Classification Search .................. 250/398, 250/492.22

See application file for complete search history.

(56) References Cited

U.S. PATENT DOCUMENTS

| | | | |
|---|---|---|---|
| 2,736,799 A | | 2/1956 | Christofilos et al. |
| 3,952,198 A | * | 4/1976 | Harada et al. .......... 250/396 ML |
| 4,558,253 A | * | 12/1985 | Bechis et al. ................ 313/414 |
| 4,994,713 A | * | 2/1991 | Chen .......................... 313/414 |
| 5,013,923 A | * | 5/1991 | Litherland et al. ....... 250/396 R |
| 5,196,707 A | * | 3/1993 | Gesley ....................... 250/398 |
| 5,350,924 A | * | 9/1994 | Stengl et al. ............. 250/492.2 |
| 5,362,968 A | * | 11/1994 | Miyoshi et al. ......... 250/396 R |
| 5,534,699 A | * | 7/1996 | Ferry ..................... 250/396 R |
| 5,852,518 A | * | 12/1998 | Hatasawa et al. ........... 359/822 |
| 6,184,526 B1 | * | 2/2001 | Kohama et al. ............. 250/310 |
| 6,525,328 B1 | * | 2/2003 | Miyoshi et al. ........ 250/492.22 |
| 6,633,366 B2 | * | 10/2003 | de Jager et al. ............... 355/67 |
| 6,784,437 B2 | * | 8/2004 | Rose ................... 250/396 ML |
| 6,822,246 B2 | * | 11/2004 | Bertsche ................ 250/492.21 |
| 7,171,038 B2 | * | 1/2007 | Adler et al. .................. 382/149 |
| 2002/0161534 A1 | * | 10/2002 | Adler et al. .................... 702/35 |
| 2003/0089685 A1 | * | 5/2003 | Ando ..................... 219/121.12 |

(Continued)

OTHER PUBLICATIONS

F.T.Cole, "O Camelot! A Memoir of the Mura Years", Apr. 1, 1994. [online], [Retrieved on Jan. 13, 2006]. Retrieved from the internet: <URL:http://epaper.kek.jp/c01/cyc2001/extra/Cole.pdf>.

(Continued)

*Primary Examiner*—David A. Vanore
*Assistant Examiner*—Bernard Souw
(74) *Attorney, Agent, or Firm*—Okamoto & Benedicto LLP

(57) ABSTRACT

One embodiment pertains to an apparatus which impinges a focused electron beam onto a substrate. The apparatus includes an irradiation source and at least two non-axisymmetric lenses. The irradiation source is configured to originate electrons for an incident electron beam. The non-axisymmetric lenses are positioned after the irradiation source and are configured to focus the beam in a first linear dimension so as to produce a linear crossover of the beam. The non-axisymmetric lenses are further configured to subsequently focus the beam in a second linear dimension, which is substantially perpendicular to the first linear dimension. Finally, the non-axisymmetric lenses are also configured to produce a focused image at an image plane. Other embodiments are also disclosed.

23 Claims, 8 Drawing Sheets

U.S. PATENT DOCUMENTS

2003/0206283 A1* 11/2003 de Jager et al. ............... 355/67
2007/0025610 A1* 2/2007 Adler et al. ................. 382/149

OTHER PUBLICATIONS

"Beam Line", Spring 1997, vol. 27, No. 1. [online], [Retrieved on Jan. 13, 2006]. Retrieved from the internet <URL: http://www.slac.stanford.edu/pubs/beamline/pdf/97i.pdf>.

Karl L. Brown, et al., "First- and Second-Order Charged Particle Optics", SLAC-PUB-3381, Jul. 1984, [online], [Retrieved on Jan. 13, 2006]. Retrieved from the internet <URL: http://www.slac.stanford.edu/pubs/slacpubs/3000/slac-pub-3381.html>.

* cited by examiner

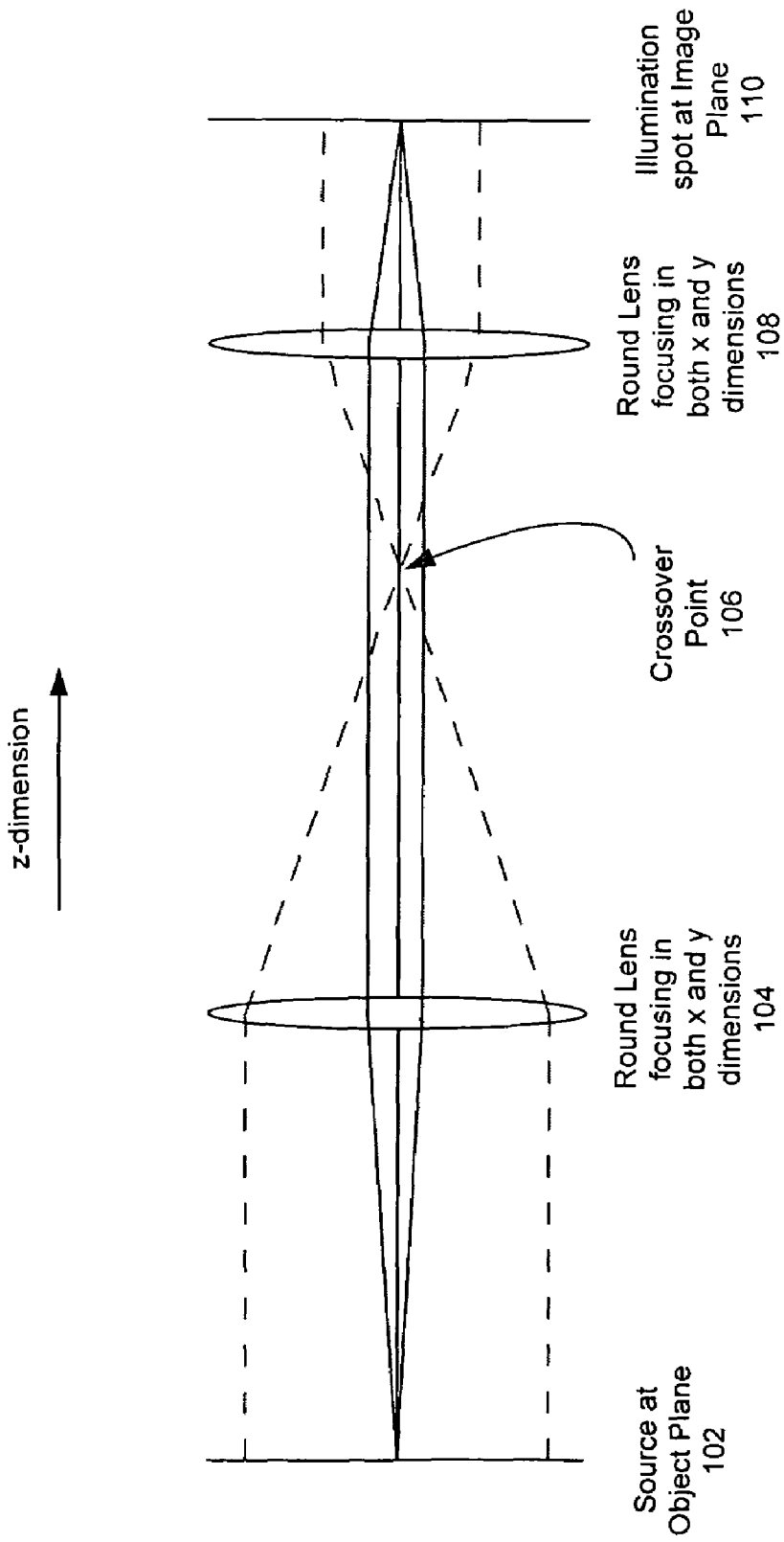
FIG. 1
(Conventional)

(xz-plane)

(yz-plane)

(xz-plane)

(yz-plane)

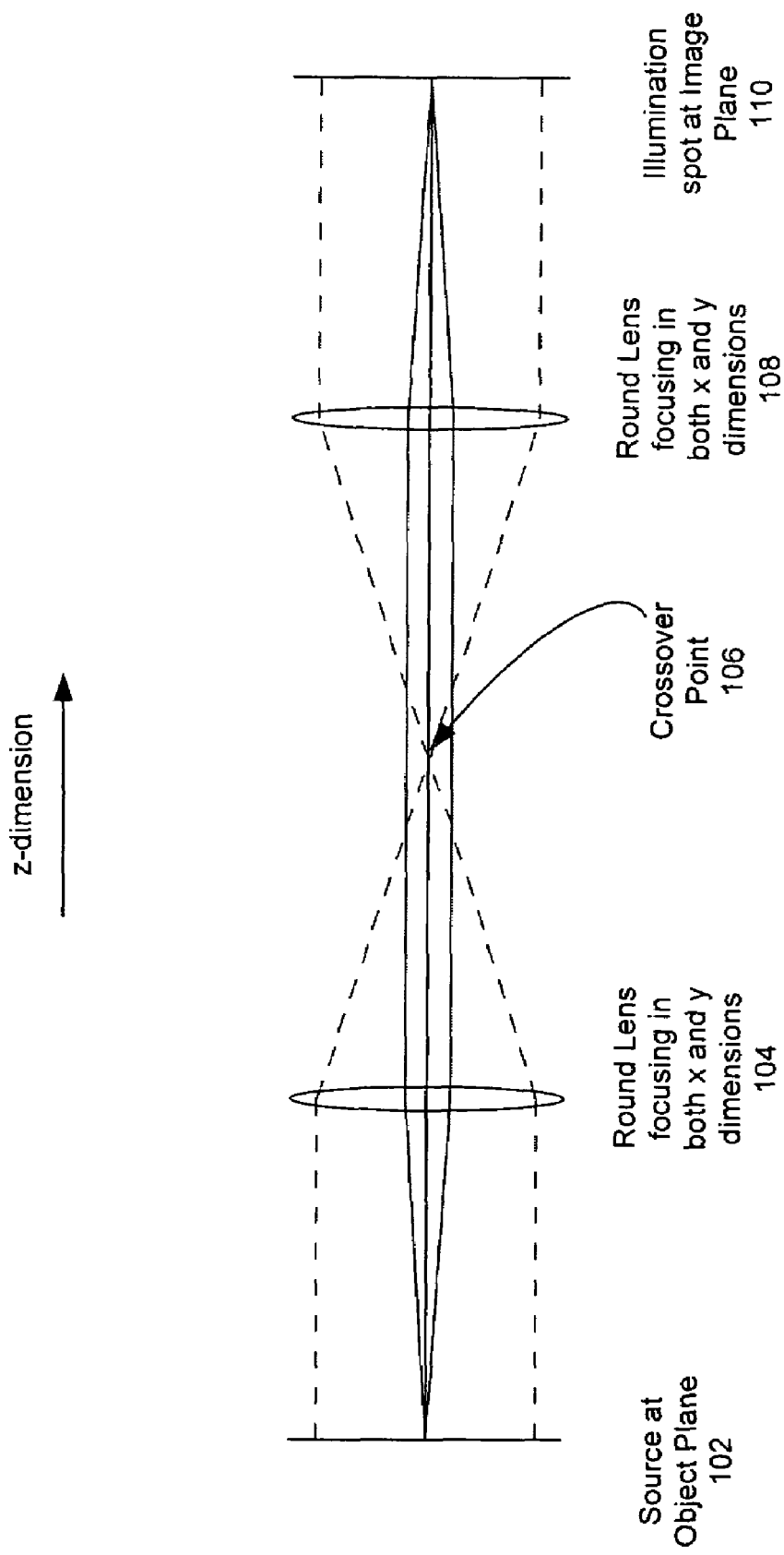
FIG. 6
(Conventional)

ELECTRON IMAGING BEAM WITH REDUCED SPACE CHARGE DEFOCUSING

CROSS-REFERENCE TO RELATED APPLICATION

The present application claims the benefit of U.S. provisional patent application No. 60/662,463, entitled "Electron Imaging Beam with Reduced Space Charge Defocusing," filed Mar. 16, 2005 by Kirk J. Bertsche and Harald F. Hess, the disclosure of which is hereby incorporated by reference.

BACKGROUND OF THE INVENTION

1. Field of the Invention

The present invention relates generally to electron beam apparatus.

2. Background

FIG. 1 is a schematic diagram of an electron-optical arrangement for generating an electron beam in a conventional imaging apparatus, and FIG. 2 is a flow chart of a conventional method of generating an electron beam in such an apparatus. For example, the apparatus may comprise an electron beam lithography apparatus, or it may comprise an electron beam inspection apparatus. In the figure, axial ray trajectories are shown as solid lines and field ray trajectories are shown as dashed.

A source 102 is defined to be located at the object plane. The source 102 generates 202 electrons at the object plane. The source 102 may comprise, for example, a conventional electron source, a linear or two-dimensional array of such sources, or an extended area source. Alternatively, it may be an extended source of secondary electrons (such as a wafer) or an aperture illuminated by primary or secondary electrons.

A first round or axisymmetric lens 104 receives the electron beam and focuses 204 it in both x and y dimensions, where the round beam is defined as traveling in the z-direction. The focusing 204 of the first round lens 104 is such that a cross-over point 106 is formed 206 by the round beam. The cross-over point 106 comprises a spot at which the charge density of the round beam becomes very densely concentrated. An aperture may optionally be placed at the field ray cross-over point 106 to limit the numeric aperture of the beam. At sufficiently high beam currents and/or sufficiently small numeric apertures, detrimental space charge defocusing effects occur at and near such a cross-over point 106.

A second round or axisymmetric lens 108 receives the electron beam after the cross-over point 106. The second round lens 108 focuses 208 the round beam in both x and y dimensions, such that an illumination spot 110 is formed 210 at an image plane. The image plane may be defined to be at a surface of a substrate, or at an electron detector.

It is desirable to improve electron beam apparatus and methods or forming incident electron beams. In particular, it is desirable to reduce space charge defocusing in electron beam apparatus for projection microscopy, lithography and other applications.

BRIEF DESCRIPTION OF THE DRAWINGS

FIG. 1 is a schematic diagram of an electron-optical arrangement for generating an electron beam in a conventional imaging apparatus. Solid lines trace trajectories of axial rays, while dashed lines trace trajectories of field rays.

FIG. 3A shows trajectories in the x-z plane, while FIG. 3B shows trajectories in the y-z plane. Solid lines trace trajectories of axial rays, while dashed lines trace trajectories of field rays.

FIG. 5A shows trajectories in the x-z plane, while FIG. 5B shows trajectories in the y-z plane. Solid lines trace trajectories of axial rays, while dashed lines trace trajectories of field rays.

FIG. 6 is a schematic diagram which shows a conventional electron-optical arrangement using round lenses for comparison to FIGS. 5A and 5B. Solid lines trace trajectories of axial rays, while dashed lines trace trajectories of field rays.

SUMMARY

Figure 2:
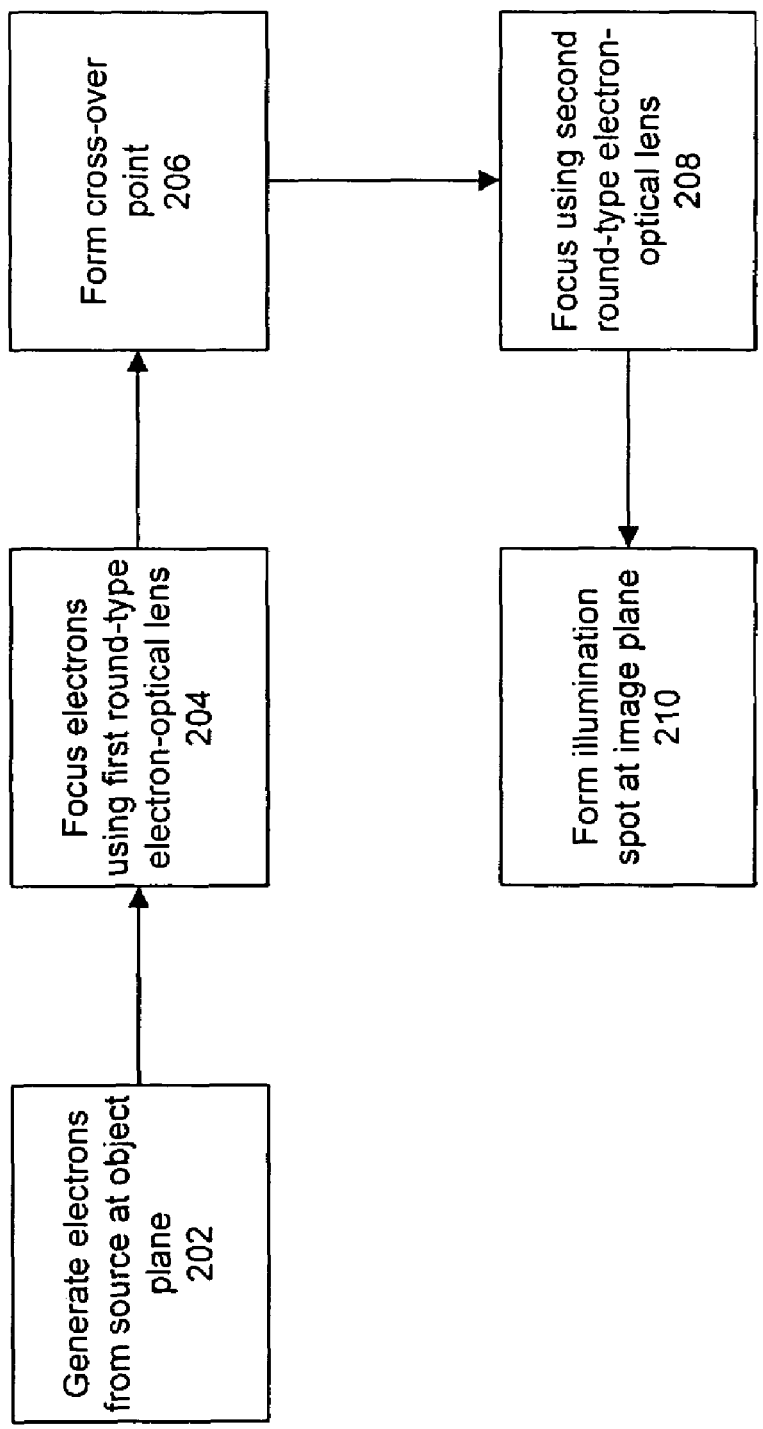
FIG. 2 is a flow chart of a conventional method of generating an electron beam.

One embodiment pertains to an apparatus which impinges a focused electron beam onto a substrate. The apparatus includes an irradiation source and at least two non-axisymmetric lenses. The irradiation source is configured to originate electrons for an incident electron beam. The non-axisymmetric lenses are positioned after the irradiation source and are configured to focus the beam in a first linear dimension so as to produce a linear crossover of the beam's field rays. The non-axisymmetric lenses are further configured to subsequently focus the beam's field rays in a second linear dimension, which is substantially perpendicular to the first linear dimension. Finally, the non-axisymmetric lenses are also configured to produce a focused image at an image plane.

Another embodiment pertains to an electron beam (e-beam) lithography apparatus for producing a pattern on a substrate. Other embodiments are also disclosed.

DETAILED DESCRIPTION

Electron beam imaging systems are often affected by space charge defocusing. For example, in the apparatus and methods discussed above in the Background section, a cross-over point 106 is formed 206. Disadvantageously, substantial space charge defocusing occurs at and near such a cross-over point 106. The space charge defocusing occurs because the electrons are close together at and near the cross-over point 106. Since like charges repel due to the electrostatic force, the electrons repel each other at that point 106, causing substantial defocusing.

If the beam current is fixed, then the system may be refocused to account for the defocusing effect of the space charge. However, for a system where the current varies significantly (for example, in the detection path of projection microscopy systems or in electron beam lithography applications), the space charge defocusing is much more problematic. If the current cannot be predicted or quickly monitored and compensated for, this space charge defocusing will present a current limitation to the system.

For a probe beam system, where charged particles emanate from a quasi-point source and are focused to a point, the effect of the space charge may be essentially uniform through the length of the system. This may be true whether or not beam crossovers (intermediate focii) exist in the system. However, for an imaging system, where an extended source is focused to an extended imaging plane, the defocusing effect of the space charge may be highly concentrated at the field ray crossovers in the system.

Conventional electron beam imaging systems typically use round (axisymmetric) lenses and round beams. In such systems, the space charge defocusing force is concentrated at the field ray crossovers of the system. This provides a significant current limitation in systems where current is not known or quickly measurable and compensable.

The present application discloses an electron beam apparatus with reduced space charge defocusing for projection microscopy, lithography and other applications. In one embodiment, an arrangement with multiple quadrupole lenses and asymmetric beams is utilized to reduce the space charge defocusing.

Figure 3A:
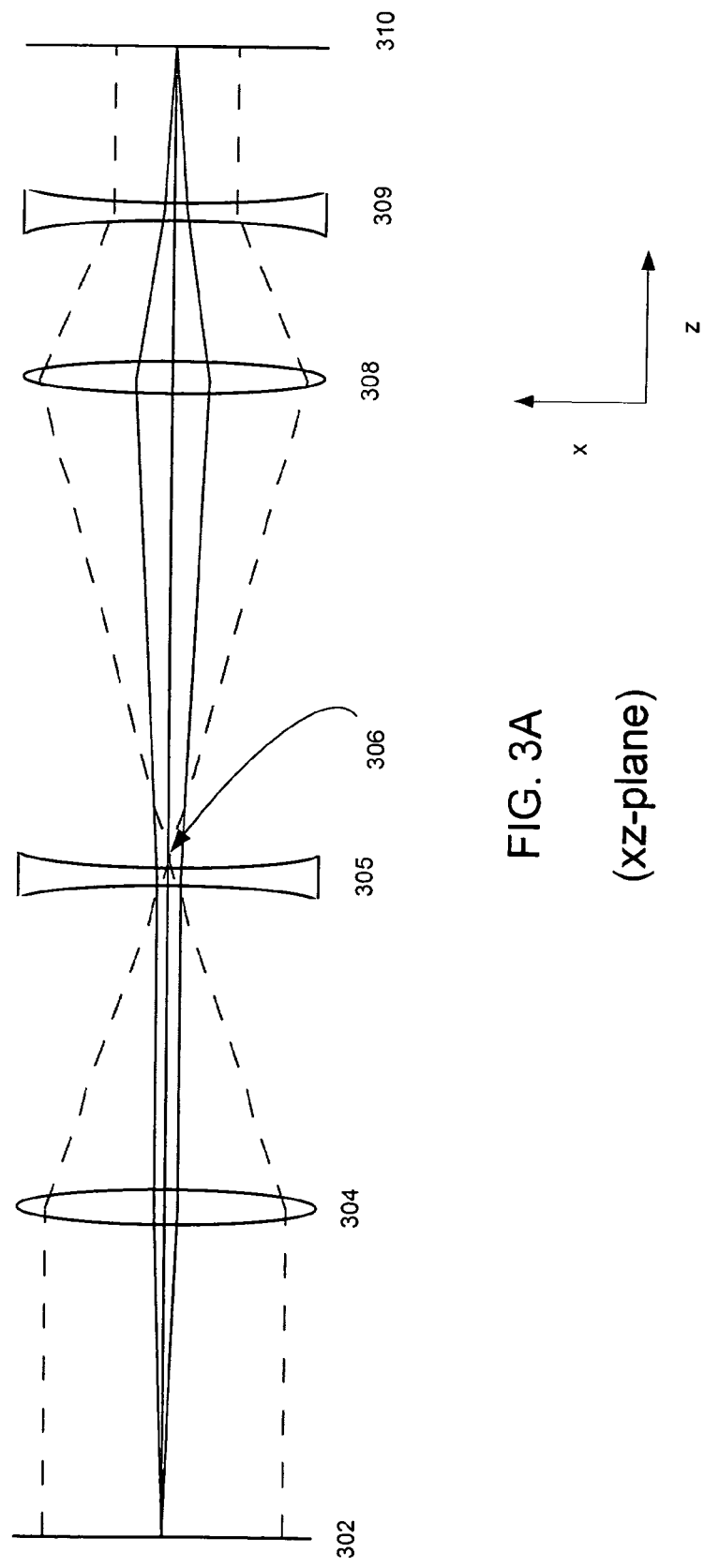
FIGS. 3A and 3B are schematic diagrams which together show an electron-optical arrangement for generating an electron beam with reduced space charge defocusing in an imaging apparatus in accordance with an embodiment of the present invention.
Figure 3B:
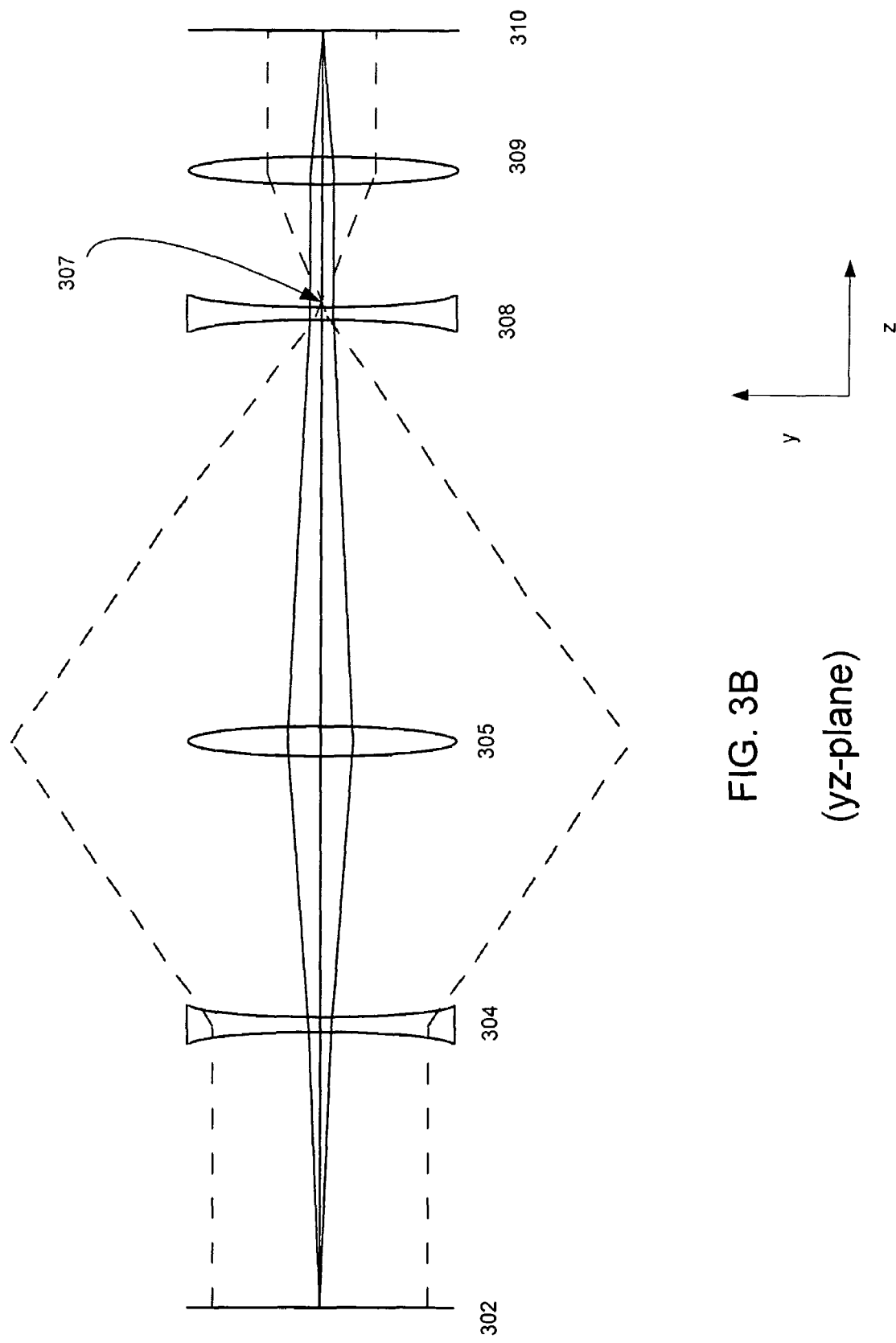
Figure 4:
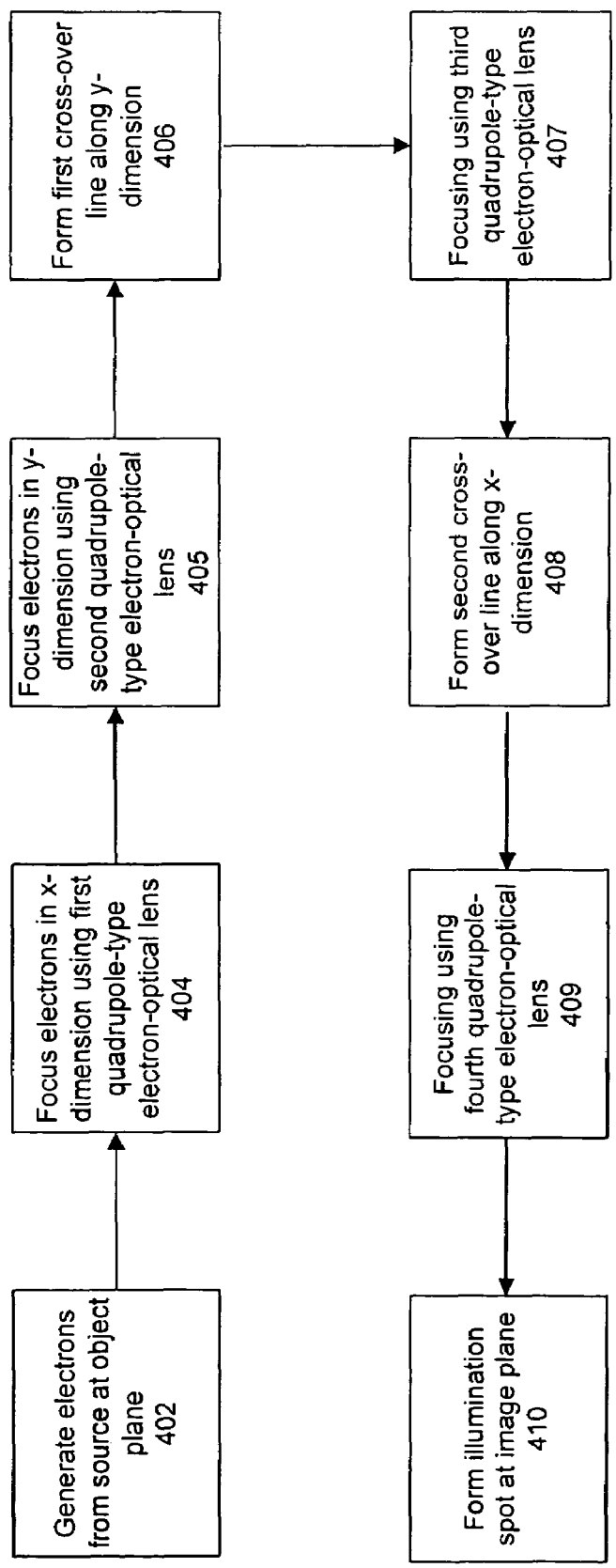
FIG. 4 is a flow chart of a method of generating an electron beam with reduced space charge defocusing in an imaging apparatus in accordance with an embodiment of the present invention.

FIGS. 3A and 3B are schematic diagrams which together show an electron-optical arrangement for generating an electron beam with reduced space charge defocusing in an imaging apparatus in accordance with an embodiment of the present invention. FIG. 3A shows trajectories in the x-z plane, while FIG. 3B shows trajectories in the y-z plane. Solid lines trace trajectories of axial rays, while dashed lines trace trajectories of field rays. FIG. 4 is a flow chart of a method of generating an electron beam with reduced space charge defocusing in an imaging apparatus accordance with an embodiment of the present invention. For example, the imaging apparatus may comprise an electron beam lithography apparatus, or it may comprise an electron beam inspection apparatus or other similar apparatus.

Like the conventional technique, a source 302 is defined to be located at the object plane. The source 302 generates 402 electrons at the object plane. The source 302 may comprise, for example, a conventional electron source.

However, unlike the conventional technique, first 104 and second 108 round lenses are not utilized. Instead, the technique disclosed herein utilizes first 304 and second 308 quadrupole lenses. Quadrupole lenses are a type of asymmetric lenses.

A first quadrupole electron-optical lens 304 receives the electron beam and focuses 404 it in one dimension. For example, the beam may be focused 404 in the x-dimension, where the beam is defined as traveling in the z-direction. A second quadrupole lens 305 focuses 405 the beam in the y-dimension (a dimension perpendicular to the dimension of focusing 404 by the first quadrupole lens 304). The combined effect of these quadrupole lenses (304 and 305) is such that a first cross-over line 306 is formed 406 by the beam. The first cross-over line 306 comprises a line at which the space charge of the beam is distributed. For example, if the beam is focused 404 in the x-dimension, then the first cross-over line 306 would be along the y-dimension (perpendicular to the dimension of the focusing by the quadrupole). A second crossover line 307 is formed downstream in the perpendicular direction (i.e. along the x-direction).

A third quadrupole electron-optical lens 308 receives the electron beam The third quadrupole lens 308 focuses 407 the beam in one dimension. The second crossover line 307 may be formed 408 after the third lens 308. This is followed by a fourth quadrupole lens 309 which focuses 409 the beam in a direction perpendicular to that of the third lens. As a result of this series of quadrupole lenses, an illumination spot 310 is formed 410 at an image plane, where the image plane may be defined to be at a surface of a substrate, or at a detector plane, or at a target surface. For example, the image plane may be a semiconductor surface being patterned lithographically by the apparatus by controllably deflecting the focused beam over the substrate.

As discussed above, the present application discloses the use of axially asymmetric lenses, rather than round lenses, in an electron imaging system. This advantageously enables field ray crossovers to become lines rather than points, and so may be used to significantly reduce the defocusing effect of space charge. Simulations show four times to twenty times reduction in defocusing for some simple system designs. A quadrupole focusing system may be designed to produce a round output beam from a round input source, though the beam in the middle of the system will not be round.

The quadrupole focusing system will, in general, have somewhat higher third order aberrations than a magnetic solenoid lens system, and the aberrations will, in general, be different along the two quadrupole axes. In accordance with an embodiment of the invention, octupole lenses may be added at positions in the system to reduce these third order aberrations. The insertion of octupole lenses into the focusing system for partial aberration correction is made simpler by the asymmetric nature of the beam in the middle of the quadrupole focusing system. One of ordinary skill in the art may determine effective placements for the octupole lenses depending upon specific details of the system implementation.

The above-discussed apparatus may be implemented in various specific configurations. For example, the quadrupole lenses may be traditional electric or magnetic quadrupole lenses, which provide focusing in one dimension and nearly equal defocusing in the perpendicular dimension. Alternatively, the quadrupole lenses may be replaced by other asymmetric lenses, such as electric slot lenses or magnetic bends (which behave like cylinder lenses, focusing in one dimension and providing no focusing in the perpendicular dimension). An arrangement of four quadrupole lenses is shown, but additional round or asymmetric lenses may be added. For some specific system designs, it may be possible to reduce the number of lenses to two asymmetric lenses and at least one additional lens, symmetric or asymmetric, or perhaps just two asymmetric lenses. Hence, the apparatus comprises at least two asymmetric lenses which images an electron source onto an area. This separates a point crossover into two line crossovers and reduces space charge defocusing. The magnification may be identical or not in the two dimensions. Additional round or asymmetric lenses may or may not be added to the system.

Figure 5A:
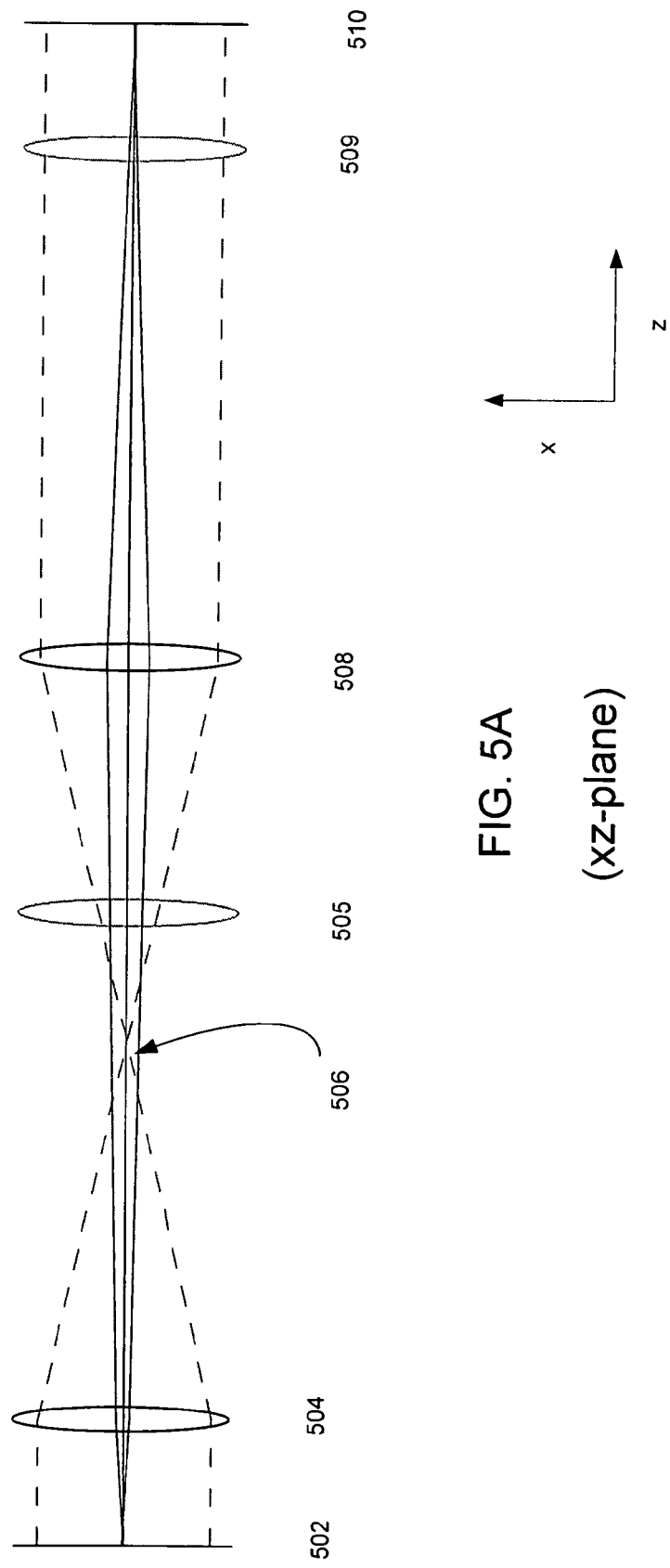
FIGS. 5A and 5B are schematic diagrams which together show an electron-optical arrangement using cylinder lenses in accordance with an embodiment of the present invention.
Figure 5B:
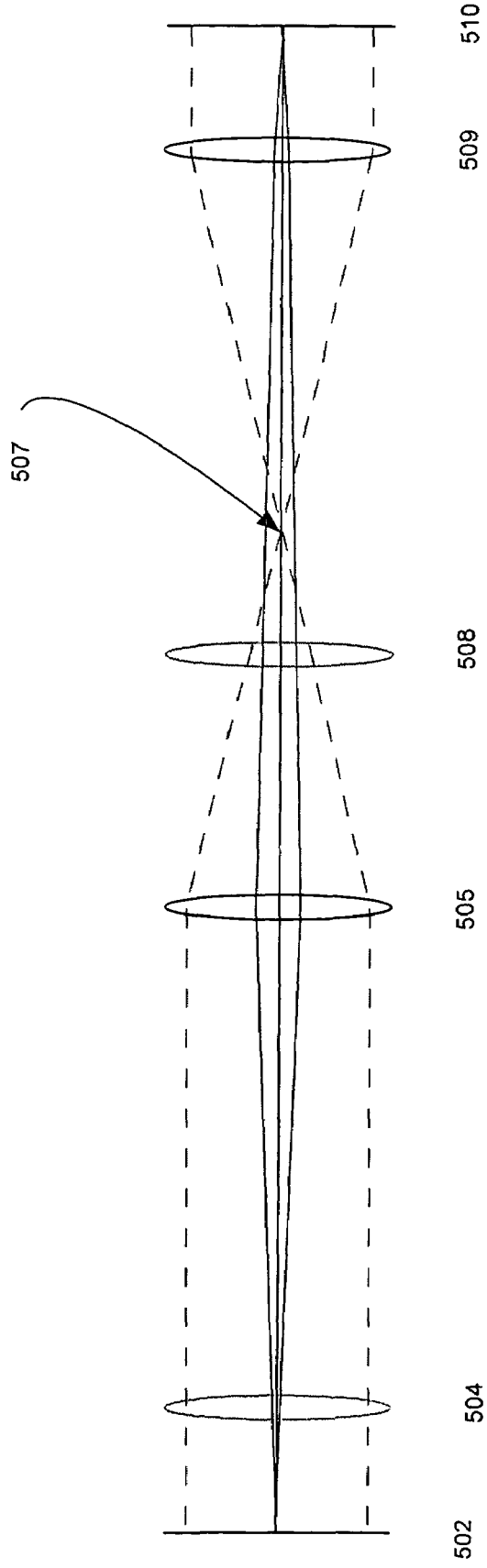
Figure 5B:
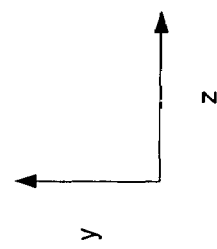

FIGS. 5A and 5B are schematic diagrams which together show an electron-optical arrangement using cylinder lenses in accordance with an embodiment of the present invention. This particular arrangement has unity magnification. FIG. 5A shows trajectories in the x-z plane, while FIG. 5B shows trajectories in the y-z plane. Solid lines trace trajectories of axial rays, while dashed lines trace trajectories of field rays. A source 502 generates electrons at the object plane. An illumination spot 510 is formed at an image plane In FIG. 5A, the cylinder lenses drawn in solid line (504 and 508) focus in the x-dimension, while the lenses drawn in dotted lines (505 and 509) focus in the y-dimension. In FIG. 5B, the cylinder lenses drawn in dotted line (504 and 508) focus in the x-dimension, while the lenses drawn in solid lines (505 and 509) focus in the y-dimension.

FIG. 6 is a schematic diagram which shows a conventional electron-optical arrangement using round lenses for comparison to FIGS. 5A and 5B. Solid lines trace trajectories of axial rays, while dashed lines trace trajectories of field rays. While the system of FIG. 1 has one-half magnification, the system of FIG. 6 has unity magnification.

Advantageously, the above-described electron-optical lens arrangements of FIGS. 3A/3B and 5A/5B have field ray crossovers or beam waists which are spread out so as to reduce undesirable space-charge defocusing. This advantage is substantial for an imaging system where the beam size is primarily determined by the field rays (rather than the axial rays) over a substantial fraction of the beamline. This typically means that the sizes of the object and image are greater than or equal to the beam size at the field ray crossovers.

The above-described diagrams are not necessarily to scale and are intended be illustrative and not limiting to a particular implementation. The above-described invention may be used, for example, in an automatic inspection or review system and applied to the inspection or review of wafers, optical masks, X-ray masks, electron-beam-proximity masks and stencil masks and similar substrates in a production environment.

In the above description, numerous specific details are given to provide a thorough understanding of embodiments of the invention. However, the above description of illustrated embodiments of the invention is not intended to be exhaustive or to limit the invention to the precise forms disclosed. One skilled in the relevant art will recognize that the invention can be practiced without one or more of the specific details, or with other methods, components, etc. In other instances, well-known structures or operations are not shown or described in detail to avoid obscuring aspects of the invention. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the claims. Rather, the scope of the invention is to be determined by the following claims, which are to be construed in accordance with established doctrines of claim interpretation.

What is claimed is:

1. An apparatus for impinging a focused electron beam onto a substrate, the apparatus comprising:
    an irradiation source of electrons configured to originate electrons for an electron beam;
    a first non-axisymmetric lens configured to focus the beam in a first linear dimension;
    a second non-axisymmetric lens configured to focus the beam in a second linear dimension which is substantially perpendicular to the first linear dimension;
    a third non-axisymmetric lens configured to focus the beam in the first linear dimension; and
    a fourth non-axisymmetric lens configured to focus the beam in the second linear dimension so as to produce a focused image of the source at an image plane,
    wherein a first cross-over line is formed along the second linear dimension between the second non-axisymmetric lens and the third non-axisymmetric lens, and
    wherein a second cross-over line is formed along the first linear dimension between the third non-axisymmetric lens and the fourth non-axisymmetric lens.

2. The apparatus of claim 1, wherein the non-axisymmetric lenses comprise electric quadrupole lenses.

3. The apparatus of claim 1, wherein the non-axisymmetric lenses comprise magnetic quadrupole lenses.

4. The apparatus of claim 1, wherein the non-axisymmetric lenses comprise electric slot lenses.

5. The apparatus of claim 1, wherein the non-axisymmetric lenses comprise magnetic bends.

6. The apparatus of claim 1, wherein space charge defocusing is reduced at the linear crossover compared with at a point-like crossover with a same current.

7. The apparatus of claim 1, wherein the irradiation source comprises an extended source, and the focused image impinges upon an extended area at the image plane.

8. The apparatus of claim 1, wherein the apparatus comprises an electron beam lithography system, and wherein the focused image is used for producing a pattern on the substrate.

9. The apparatus of claim 1, wherein the apparatus comprises an electron beam imaging system, and wherein the focused image is used for inspecting a surface of the substrate.

10. The apparatus of claim 1, further comprising:
    a beam current controller coupled to the irradiation source for varying a current of the beam and hence a current at the focused image.

11. The apparatus of claim 1, further comprising octupole lenses configured so as to reduce third-order aberrations in the beam.

12. A method of focusing a beam of electrons onto a substrate, the method comprising:
    originating electrons for an electron beam from an irradiation source of electrons; and
    focusing the electron beam in a first linear dimension by a first non-axisymmetric lens;
    focusing the electron beam in a second linear dimension by a second non-axisymmetric lens, the second linear dimension being substantially perpendicular to the first linear dimension;
    focusing the electron beam in the first linear dimension by a third non-axisymmetric lens; and
    focusing the electron beam in the second linear dimension by a fourth non-axisymmetric lens such that a focused image of the source is produced at an image plane.
    wherein a first cross-over line is formed along the second linear dimension between the second non-axisymmetric lens and the third non-axisymmetric lens, and
    wherein a second cross-over line is formed along the first linear dimension between the third non-axisymmetric lens and the fourth non-axisymmetric lens.

13. The method of claim 12, wherein space charge defocusing is reduced at the spread-out crossover compared with at a point-like crossover with a same current.

14. The method of claim 12, wherein the incident beam is generated from an extended source, and the focused image impinges upon an extended area at the image plane.

15. The method of claim 12, wherein the method is performed in an electron beam lithography system, and wherein the focused image is used for producing a pattern on the substrate.

16. The method of claim 12, wherein the method is performed in an electron beam imaging system, and wherein the focused image is used for inspecting a surface of the substrate.

17. The method of claim 12, further comprising:
    controllably varying a current of the beam and hence a current at the focused image.

18. The method of claim 12, further comprising passing the beam through octupole lenses so as to reduce third-order aberrations in the beam.

19. An electron beam (e-beam) lithography apparatus for producing a pattern on a substrate, the lithography apparatus comprising:

an irradiation source of electrons configured to originate electrons for an electron beam;

a first non-axisymmetric lens configured to focus the beam in a first linear dimension;

a second non-axisymmetric lens configured to focus the beam in a second linear dimension which is substantially perpendicular to the first linear dimension;

a third non-axisymmetric lens configured to focus the beam in the first linear dimension; and a fourth non-axisymmetric lens configured to focus the beam in the second linear dimension so as to produce a focused image of the source at an image plane; and controllable deflectors configured to control movement of the focused image so as to produce a pattern on the substrate, wherein a first spread-out field ray crossover is formed between the second non-axisymmetric lens and the third non-axisymmetric lens, and wherein a second spread-out field ray crossover is formed between the third non-axisymmetric lens and the fourth non-axisymmetric lens.

20. The e-beam lithography apparatus of claim 19, wherein space charge defocusing is reduced at each said spread-out field ray crossover compared with at a point-like crossover at a same current level.

21. The e-beam lithography apparatus of claim 19, wherein the irradiation source comprises a quasi-point electron source, and the focused image impinges upon a round area on the substrate.

22. The e-beam lithography apparatus of claim 19, further comprising:

a beam current controller coupled to the irradiation source for varying a current of the beam and hence a current at the focused image.

23. The e-beam lithography apparatus of claim 19, octupole lenses configured so as to reduce third-order aberrations in the beam.

* * * * *